United States Patent [19]

Konishi et al.

[11] Patent Number: 5,250,114
[45] Date of Patent: Oct. 5, 1993

[54] COATING APPARATUS WITH NOZZLE MOVING MEANS

[75] Inventors: Nobuo Konishi, Kofu; Hideyuki Takamori, Kumamoto; Masami Akimoto, Kumamoto; Kiyohisa Tateyama, Kumamoto, all of Japan

[73] Assignees: Tokyo Electron Limited, Tokyo; Tokyo Electron Kyushu Limited, Kumamoto, both of Japan

[21] Appl. No.: 755,781

[22] Filed: Sep. 6, 1991

[30] Foreign Application Priority Data

Sep. 7, 1990 [JP] Japan .................. 2-237664

[51] Int. Cl.⁵ ............... H01L 21/68; H01L 21/30; B05B 3/00
[52] U.S. Cl. ................. 118/321; 118/323; 118/326; 118/501; 118/52
[58] Field of Search .......... 118/52, 321, 323, 326, 118/64, 500, 501; 427/422, 421

[56] References Cited

U.S. PATENT DOCUMENTS

| | | | |
|---|---|---|---|
| 3,904,339 | 9/1975 | Dunn | 118/321 |
| 4,158,343 | 6/1979 | Nord | 118/323 |
| 4,190,015 | 2/1980 | Hillman | 118/321 |
| 4,416,213 | 11/1983 | Sakiya | 118/321 |
| 4,889,069 | 12/1989 | Kawakami | 118/52 |
| 4,941,426 | 7/1990 | Sago et al. | 118/52 |
| 4,989,345 | 2/1991 | Gill, Jr. | 118/52 |
| 5,002,008 | 3/1991 | Ushijima et al. | 118/321 |
| 5,061,144 | 10/1991 | Akimoto et al. | 118/500 |
| 5,089,305 | 2/1992 | Ushijima et al. | 118/321 |
| 5,095,848 | 3/1992 | Ikeno | 118/52 |

FOREIGN PATENT DOCUMENTS

| | | |
|---|---|---|
| 58-124241 | 7/1983 | Japan . |
| 62-195118 | 8/1987 | Japan . |
| 1-276722 | 11/1989 | Japan .................. 118/323 |

*Primary Examiner*—Mary Wilczewski
*Attorney, Agent, or Firm*—Oblon, Spivak, McClelland, Maier & Neustadt

[57] ABSTRACT

A coating apparatus includes two spin chucks located in a single casing to support and rotate wafers. A waiting trench is located between the spin chucks to discharge that part of coating liquid which has been hardened at the tip of a nozzle. The wafers are loaded and unloaded to and from the spin chucks by a single carrying member located outside the casing. A coating liquid supply mechanism includes the single nozzle for dispensing coating liquid onto the wafers supported by the spin chucks. The nozzle is moved between the spin chucks by a moving arm. Processing cycles relative to the spin chucks are set for a same processing time and the processing cycle relative to one of the spin chucks is shifted from that relative to the other by a half cycle. The nozzle is rested on the waiting trench at the time when it does not dispense the coating liquid onto the wafers supported by the spin chucks.

8 Claims, 7 Drawing Sheets

COATING APPARATUS WITH NOZZLE MOVING MEANS

Background of the Invention

1. Field of the Invention

The present invention relates to an apparatus and a method for coating substrates, particularly semiconductor wafers.

2. Description of the Related Art

As the conventional coating apparatus of this kind, there can be mentioned the apparatus for use with the semiconductor manufacturing system to coat resist liquid to semiconductor wafers.

This resist coating apparatus usually comprises a processing unit including a spin chuck for sucking, holding and rotating the semiconductor wafer and a cup for housing the semiconductor wafer on the spin chuck therein to conduct the coating process of resist liquid relative to the semiconductor wafer, and a resist nozzle for dispensing the resist liquid onto the semiconductor wafer in the cup.

The resist liquid is dropped onto the semiconductor wafer through the resist nozzle and the semiconductor wafer is rotated at high speed by the spin chuck, so that resist film can be uniformly coated on the semiconductor wafer by centrifugal force thus created.

In the case of this conventional coating apparatus, one resist nozzle is used for one processing unit and after the resist liquid is dispensed onto the semiconductor wafer through the resist nozzle, the resist nozzle is held ready for a next process until a series of coating steps relative to the semiconductor wafer are finished. After these coating steps relative to the semiconductor wafer are finished, a next semiconductor wafer is carried into the processing unit and the resist nozzle dispenses the resist liquid onto this semiconductor wafer. Therefore, the interval at which the resist liquid is dispensed onto the semiconductor wafers through the resist nozzle becomes long and that part of the resist liquid which is at the tip of the resist nozzle is likely to become hard while the resist nozzle is waiting for a next dispensation of the resist liquid. This hardening of the resist liquid causes the semiconductor wafers not to be uniformly coated with the resist liquid and the quality of products not to be kept certain. The yield of products is thus made low.

As disclosed in Published Unexamined Japanese Patent Applications No. 58-124241 and No. 62-195118, there is conventionally well-known another coating apparatus intended to double its processing efficiency by using two processing units. Even in the case of this apparatus, however, one resist nozzle is also used only for one processing unit. As already mentioned above, therefore, the interval of dispensing the resist liquid onto the semiconductor wafers is also long and the yield of products is thus made low by the hardening of the resist liquid at the tip of the resist nozzle. Further, the whole of the apparatus becomes complicated in structure. In addition, the resist liquid coating process cannot be uniformly applied to the semiconductor wafers because the two resist nozzles are independently used for their corresponding processing units.

SUMMARY OF THE INVENTION

The present invention is therefore intended to provide coating apparatus and method capable of shortening the interval of dispensing the resist liquid onto the semiconductor wafers through the resist nozzle to prevent the resist liquid from being deteriorated by its hardening at the tip of the resist nozzle, making the productivity higher and the whole of the apparatus simpler in structure, and keeping the resist liquid coating process certain every processing unit.

According to a first aspect of the present invention, there can be provided a coating apparatus comprising at least two substrate support members each serving to support and rotate a substrate; a casing for enclosing the support members in a same atmosphere; a substrates carrying member located outside the casing to load and unload substrates to and from the support members; coating liquid supply means including a nozzle for supplying coating liquid onto the substrates supported by the support members; moving means for moving the nozzle between the substrate support members; and a waiting trench located between the support members to discharge that part of the coating liquid which stays in the nozzle.

According to a second aspect of the present invention, there can be provided a coating apparatus comprising at least two substrate support members each serving to support and rotate a substrate; substrate carrying means for loading and unloading the substrates to and from the support members; a coating liquid supply means including a nozzle for supplying coating liquid onto the substrates supported by the support members; and nozzle moving means for moving the nozzle between the substrate support members.

According to a third aspect of the present invention, there can be provided a coating method for use with the coating apparatus according to the first aspect of the present invention comprising the steps of: setting processing cycles relative to the support members for same processing time in such a way that the processing cycle relative to one of the support members is shifted from that relative to the other by a half cycle; and resting the nozzle on the waiting trench at the time when the nozzle does not supply the coating liquid onto the substrates supported by the support members.

According to a coating apparatus of the present invention, coating liquid supply can be made to a substrate on one of the support members even while the coating process is being conducted after coating liquid supply is made to another substrate on the other of the support members, thereby enabling the waiting time of the nozzle to be shortened. This prevents the coating liquid from being hardened or deteriorated at the tip o the nozzle at the time when the nozzle is held or rested ready for a next dispensation of the coating liquid. This also enables the nozzle to dispense an appropriate amount of the coating liquid onto the substrate supported by the support member, because narrowing of the coating liquid path of the nozzle due to the hardening of the liquid is prevented.

Further, only one nozzle is enough for plural support members. This enables the whole of the coating apparatus to be made simpler in structure. Furthermore, the coating liquid is supplied and coated onto the substrates supported by the plural support members through one nozzle, thereby enabling the coating process to be made certain in relation to the plural substrates. In addition, the plural support members may be arranged in a same processing atmosphere in order that the coating quality is made uniform in relation to all of the substrates supported by the support members when the support members are arranged plural.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

DETAILED DESCRIPTION OF THE PREFERRED EMBODIMENTS

Figure 1:
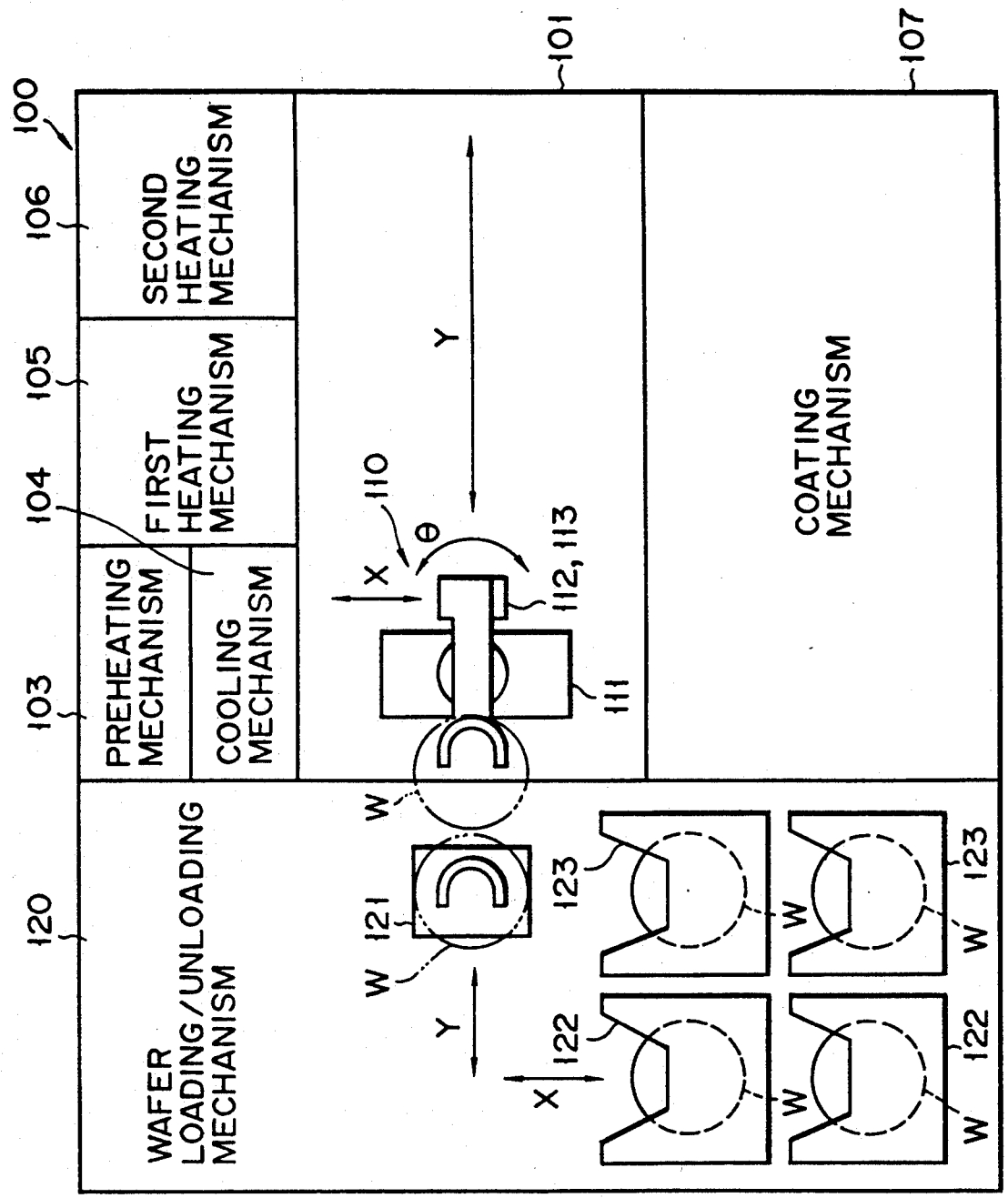
FIG. 1 schematically shows a system for coating resist liquid to semiconductor wafers in which a coating apparatus according to the present invention is incorporated.

A coating system 100 shown in FIG. 1 can carry out all of processes starting from carrying semiconductor wafers into the system and ending with coating them in the system. This coating system 100 comprises a housing 101, and pre-heating, cooling, first and second heating and coating mechanisms 103, 104, 105, 106, and 107 each being arranged in the housing 101. A passage is arranged at the center of the housing 101, extending in the horizontal direction of the housing 101. The pre-heating, cooling, first and second heating mechanisms 103, 104, 105 and 106 are located on one side of the passage 102 and the coating mechanism 107 on the other side of the passage. Although the pre-heating and cooling mechanisms 103 and 104 are arranged side by side in FIG. 1, the cooling mechanism 104 is located in fact under the pre-heating mechanism 103.

A wafer carrying means 110 is arranged in the passage to move through the passage. The wafer carrying means 110 includes a body 111 and two wafer sucking and holding tweezers 112 and 113. The body 111 can move along the passage in a direction (or traverse direction) Y and up and down in a direction (or perpendicular direction) Z. The tweezers 112 and 113 can become operative together in a direction (or rotating direction) θ but in a direction (or lengthwise direction) X independently of the other. They can carry a wafer W into and out of an optional one of the above-mentioned mechanisms 103-107 and also carry and receive it to and from a wafer loading/unloading mechanism which will be described later.

The wafer loading/unloading mechanism 120 is located by the housing 101 and it is provided with wafer cassettes 122 in which wafers W which will be process are housed, and with wafer cassettes 123 in which wafers W which have been process are housed. It also includes a tweezer 121 movable in the directions X and Y while sucking and holding the wafer W, and the unprocessed wafer W is picked up from one of the cassettes 122 by the tweezer 121 and the processed wafer W is received from one of the tweezers of the carrying means 120 by the tweezer 121. The wafer W can be transferred and received between the tweezers 112, 113 of the carrying means and the one 121 of the wafer loading/unloading mechanism 120 at the interface of the passage relative to the wafer loading/unloading mechanism 120.

Figure 2:
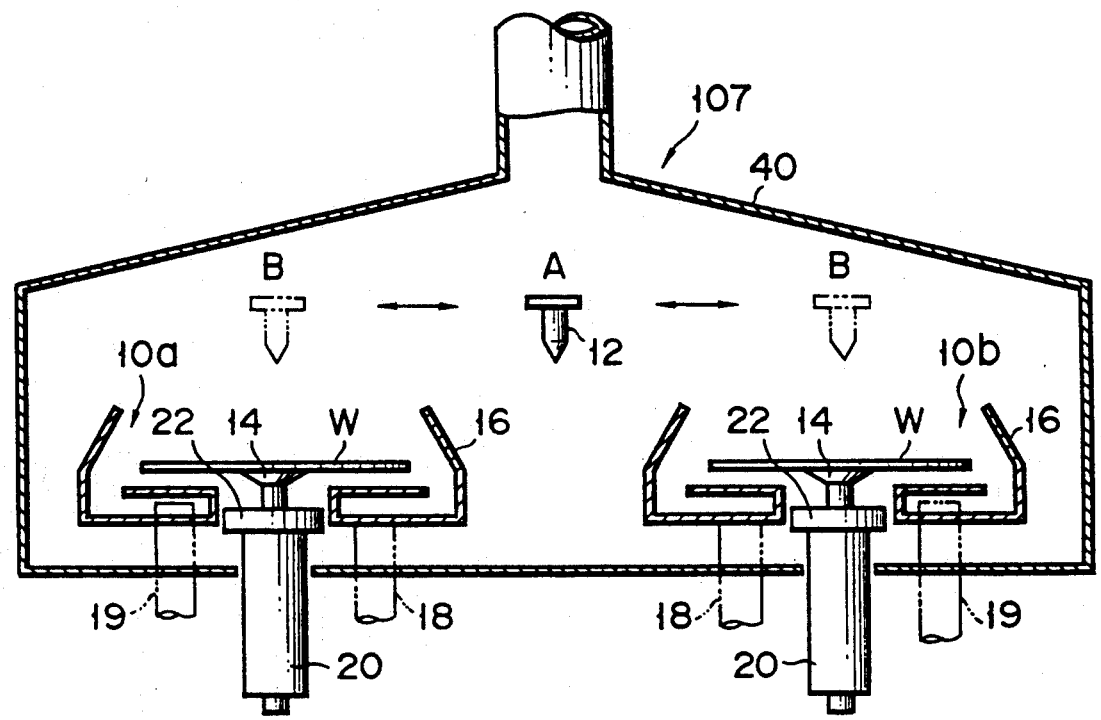
FIG. 2 is a sectional view showing the coating apparatus enlarged.
Figure 3:
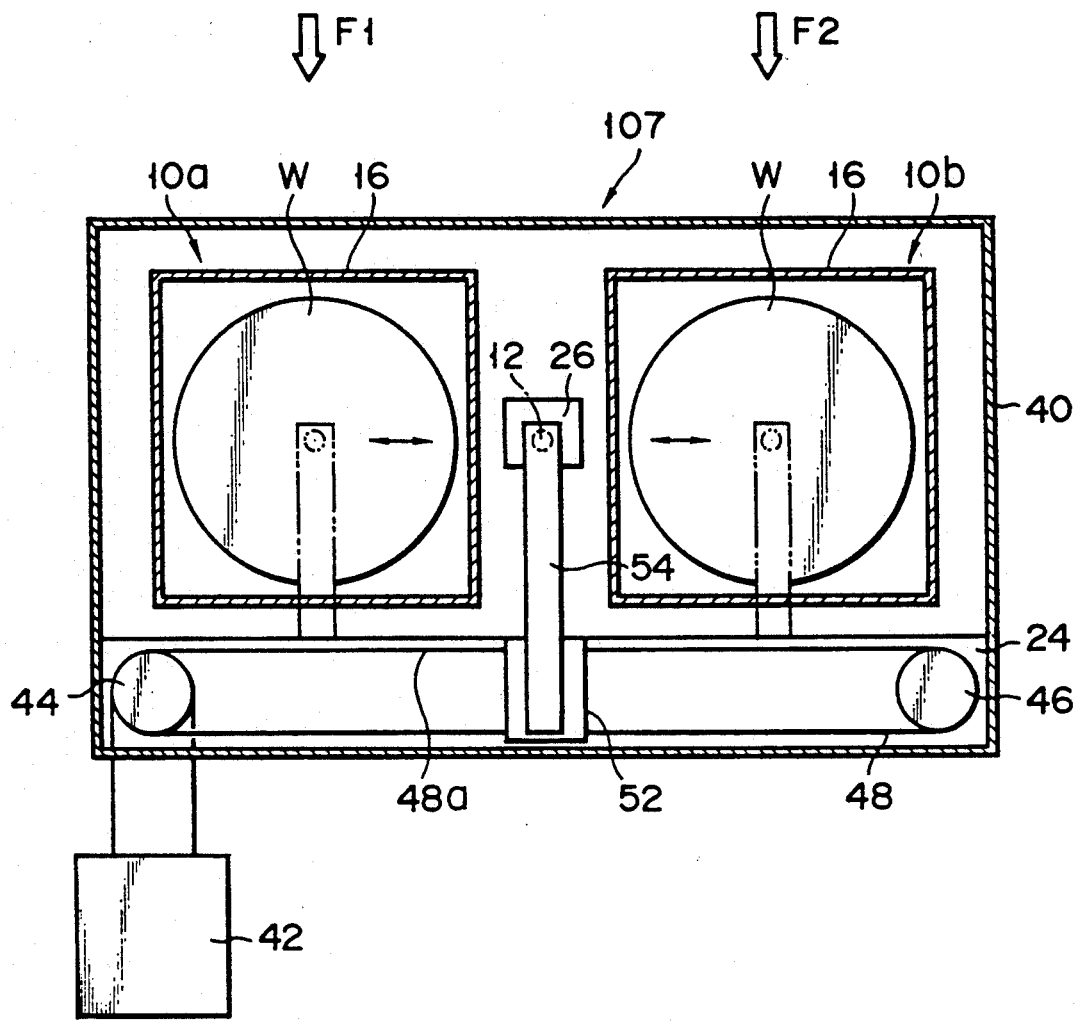
FIG. 3 is a sectional view showing the coating apparatus enlarged.

FIGS. 2 and 3 show the coating mechanism 107 in detail. Two processing units 10a and 10b are arranged in a common casing 40 and a resist nozzle 12 is located to be used commonly by the two processing units 10a and 10b. Both of the processing units 10a and 10b are arranged in the same atmosphere in the casing 40, thereby enabling the wafers W to be uniformly processed in both processing units 10a and 10b.

Each of the processing units 10a and 10b is provided with a support 14 such as the spin chuck, which is fixed to the output shaft of a motor 20 so as to rotate that semiconductor wafer W at high speed which has been mounted and temporarily fixed on the spin chuck 14 by vacuum suction.

The motor 20 is a high performance one, excellent in acceleration, and it has a flange 22 at its top, by which it is fixed at an appropriate position in the coating mechanism or apparatus. The temperature of the flange 22 can be adjusted by a temperature adjuster not to transmit the heat of the motor 20 above the flange 22.

The semiconductor wafer W on the spin chuck 14 is enclosed by a cup 16 to prevent the coating or resist liquid from being scattered outside the coating apparatus and onto the another adjacent semiconductor wafer W at the time when it is being coated with the resist liquid. The cup 16 can move up and down and it is lifted to such a position as shown in FIG. 2 and stopped there at the time when the semiconductor wafer W is to be coated with the resist liquid, while it is lowered downward from the position at the time when the wafer W is to be carried into and out of the processing unit. Drain and exhaust pipes 18 and 19 are connected to the underside of each of the cups 16.

The resist nozzle 12 is intended to supply or drop the resist liquid onto the semiconductor wafer W at such a position that is above and substantially in the center of the semiconductor wafer W supported by the spin chuck 14 in each of the processing units 10a and 10b. The resist nozzle 12 is freely moved or reciprocated between a waiting position A and the resist liquid dropping position B in each of the processing units 10a and 10b, while being supported by the tip of an arm 54 of a nozzle moving means 24.

The cycle of coating the resist liquid onto the wafer W in one of the processing units 10a and 10b is shifted from that in the other processing unit by a half cycle. In short, after the resist nozzle 12 is moved from its waiting position A to one of the positions B above the one processing unit 10a (or 10b) and caused to dispense the resist liquid onto the wafer W in this processing unit 10a (or 10b), it is first returned to its waiting position A and then moved to the other of the positions B above the other processing unit 10b (or 10a) to dispense the resist liquid onto the other wafer W in the other processing unit 10b (or 10a). In a case where no dispensation of the resist liquid is carried out through the resist nozzle 12 ever certain time period at the time when the process is shifted from one lot to the other, for example, dummy dispensations of the resist liquid are carried out through the resist nozzle 12 at the waiting position A in order that the resist liquid is prevented from hardening after contacting air for a long time, a waiting trench 26 which enables dummy dispensations of the resist liquid to be conducted through the resist nozzle 12 is arranged for this purpose at the waiting position A. The resist nozzle 12 may thus be held in the resist liquid for a case where a waiting time is necessary during the exchange of wafers.

In order to prevent the resist liquid from dropping during transfer of the nozzle, the resist liquid is sucked back after the dispensation.

The nozzle moving means 24 is located between right and left rollers 44 and 46 and it includes an endless belt 48 which is driven right and left by a motor. A block 52 movable right and left together with a part 48a of the belt 48 is attached to the belt 48. The arm 54 is supported movable up and down by the moving block 52 and the resist nozzle 12 is supported at the tip of the arm 54.

Figure 8:
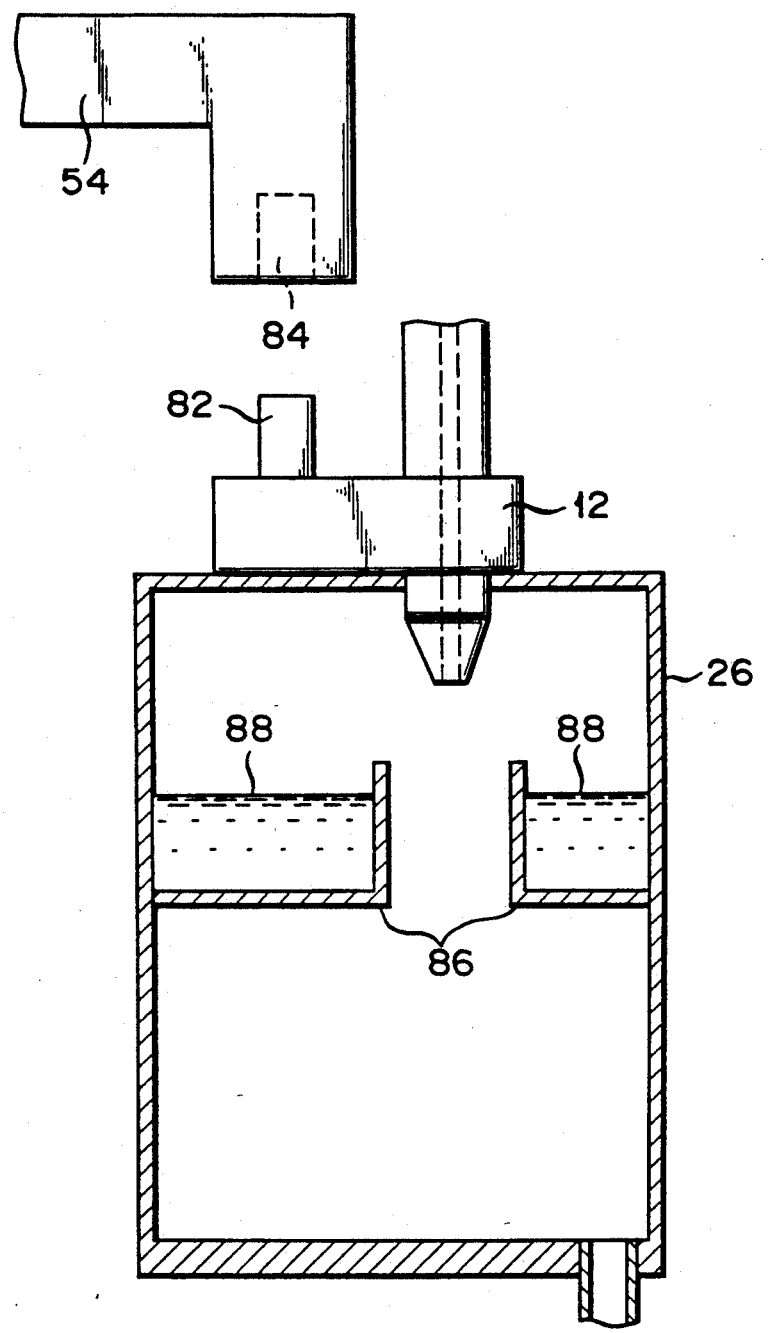
FIG. 8 is a view showing an example of coupling a nozzle with an arm for moving it, and an example of a waiting trench.

FIG. 8 shows an example of detachably coupling the nozzle 24 with the arm 54. A projecting portion 82 is integrally formed on the body of the nozzle 24 and a clamping hole 84 having a size corresponding to the portion 82 is formed on the tip of the arm 54. The portion 82 is detachably held by a clamp member, which is controlled electrically, provided in the hole 84. The nozzle 12 sits on the waiting trench 26 when freed by the arm 54. A volatile organic solvent 88 is reserved in a pool 86 so as to decrease the hardening of the resist liquid.

Figure 4:
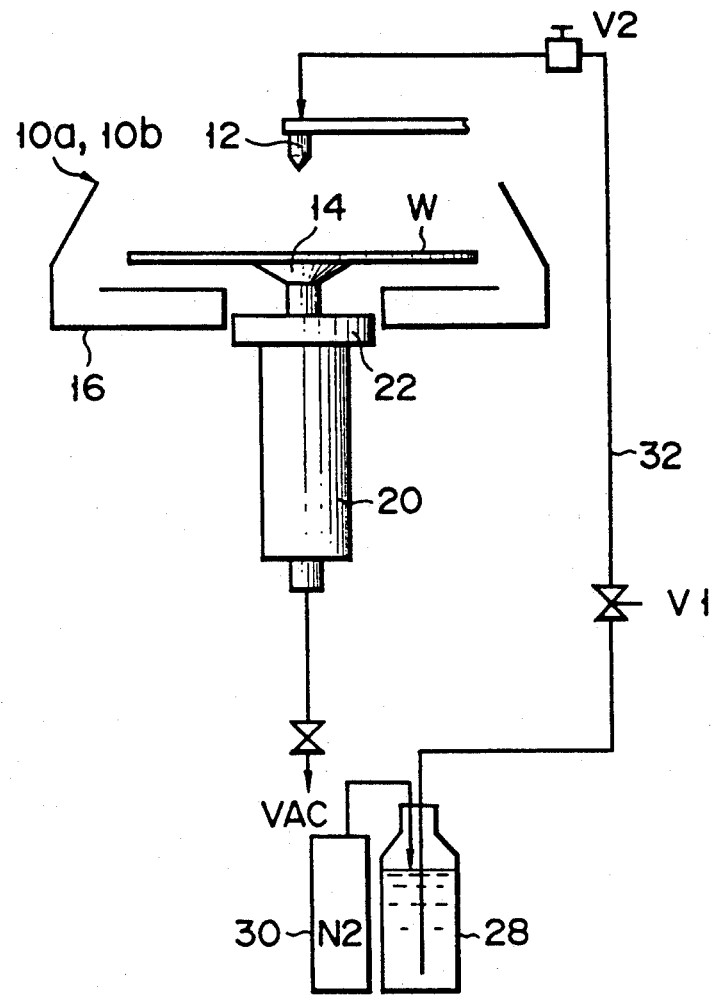
FIG. 4 is a view intended to explain a line through which the resist liquid is supplied to the coating apparatus.

FIG. 4 shows a line through which the resist liquid is supplied to the resist nozzle 12. This line is a pipe 32 extending from a resist liquid vessel 28 and an $N_2$ pressurizing section 30 to the resist nozzle 12. The pipe 32 includes a valve V1 and a suck-back valve V2 on the way thereof. The suck-back valve V2 is intended to pull into the resist nozzle 12 that part of the resist liquid which is exposed from the tip of the resist nozzle 12 because of surface tension after the resist liquid is dispensed through the resist nozzle 12. The resist liquid at the tip of the resist nozzle 12 can be thus prevented from becoming hard.

Figure 5:
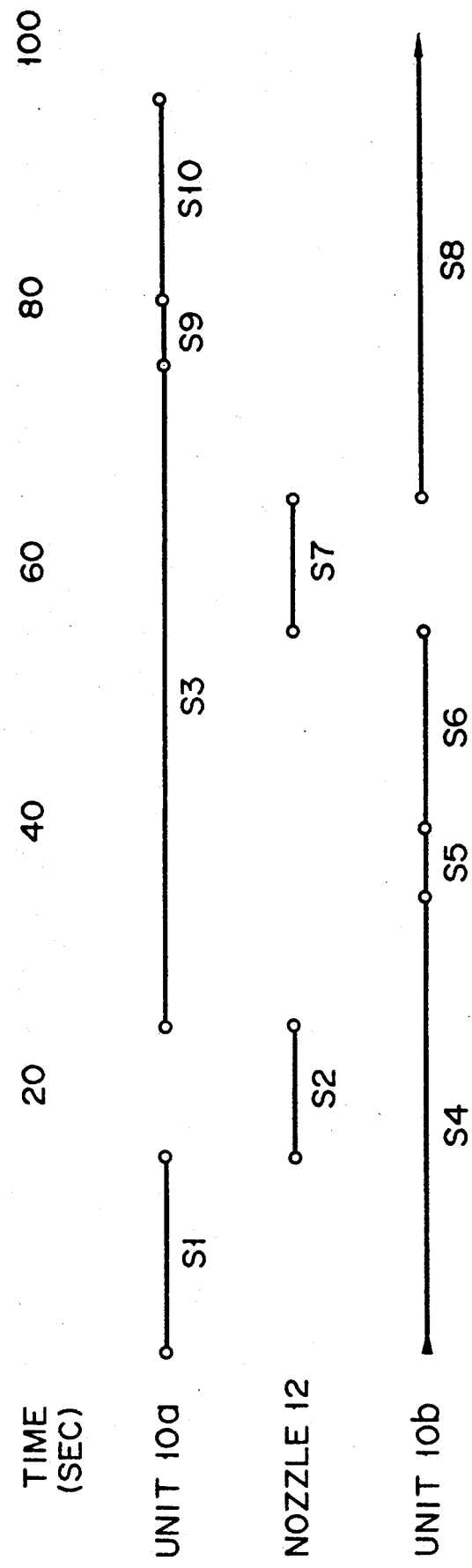
FIG. 5 is a time chart intended for a coating method according to the present invention.

A coating method according to the present invention will be described referring to a time chart shown in FIG. 5. The process described below is automatically carried out by using a program stored in a computer.

When the resist nozzle 12 is at its waiting position A, a wafer which is not processed yet is carried onto the spin chuck 14 in the one processing unit 10a. The wafer is carried into the processing unit 10a in a direction F1 in FIG. 3 by the carrying means 110 (see FIG. 1). If the previous wafer which has been processed is still on the spin chuck 14 in the processing unit 10a, it is removed from the spin chuck 14 by one of the tweezers 112 and 113 of the carrying means 110 and the next wafer carried is mounted on the chuck 14 by the other tweezer (Step S1 in FIG. 5). The center of the wafer is automatically aligned with the center of rotation of the chuck 14 at this time.

The arm 54 is then moved to grip and pull the resist nozzle 12 out of the waiting trench 26 at the waiting position A and further moved above the wafer on the spin chuck 14 in the unit 10a while holding the resist nozzle 12. The resist liquid is dispensed or dropped onto the wafer through the resist nozzle 12 at this position, such as the center of the wafer. The resist nozzle 12 is then moved to the waiting position A by the arm 54 and supported by the waiting trench 26 (Step S2).

The chuck 14 in the unit 10a is rotated to uniformly scatter and coat the resist liquid on the wafer due to centrifugal force thus created (Step S3).

The coating step caused by the rotation of the chuck 14 is already advancing in the other unit 10b prior to the step S1 in such a manner that the processing cycle in the other unit 10b is half shifted from that in the one unit 10a (Step S4).

After the coating is finished by the rotation of the spin chuck 14 in the other processing unit 10b, the cup 16 is lowered while the chuck 14 is lifted in this unit 10b (Step S5).

A wafer which is not processed yet is carried onto the chuck 14 in the other unit 10b in a direction F2 in FIG. 3 by the carrying means 110. The wafer which has been processed is removed this time from the chuck 14 by the one 112 (or 113) of the tweezers 112 and 113 of the carrying means 110 and the next wafer which has been carried is mounted on the chuck 14 by the other 113 (or 112) (Step S6).

The arm 54 is then moved to grip and pick up the resist nozzle 12 out of the waiting trench 26 at the waiting position A and further moved above the wafer mounted on the chuck 14 in the unit 10b while holding the resist nozzle 12. The resist liquid is dropped onto the wafer through the resist nozzle 12 at this position. The resist nozzle 12 is then again moved to the waiting position A by the arm 54 and supported by the waiting trench 26 (Step S7).

The chuck 14 in the unit 10b is rotated to create centrifugal force, by which the resist liquid is uniformly scattered and coated on the wafer (Step S8).

The coating caused by the rotation of the chuck 14 is finished in the unit 10a after the coating caused by the rotation of the chuck 14 is started in the unit 10b, and the cup 16 is lowered while the chuck 14 is lifted in the unit 10a (Step S9).

A wafer which is not processed yet is again carried onto the chuck 14 in the unit 10a by the carrying means 110 (Step S10).

When the one resist nozzle 12 is used commonly by the two processing units 10a and 10b in this manner, the interval at which the resist liquid is dispensed onto the wafer through the resist nozzle 12 can be shortened and the hardening of the resist liquid at the tip of the resist nozzle 12 which has often been seen in the case where the interval of resist liquid dispensations is long can be thus reduced or prevented. When this interval is made shorter, as described above, there is created the possibility that the dummy dispensations at the waiting trench 26 become unnecessary.

Further, only one resist nozzle 12 is enough for the coating apparatus and this enables the whole of the apparatus to be made simpler in structure. In addition, the resist nozzle 12 is common to the two processing units and the resist liquid is thus made common to them.

The uniformity of processes conducted in the two processing units can be thus expected.

Although the mechanism for coating the resist liquid to the semiconductor wafers has been mentioned as an example of the coating apparatus in the above-described embodiment, the present invention is not limited to this mechanism but it can be applied to various kinds of coating apparatus such as those intended to coat the resist liquid, developer and magnetic matter to masks.

Although the arm 54 has been slid right and left in the above-described embodiment, it may be swung.

Although the two processing units have been used in the above-described embodiment, three or more processing units may be used. Further, it may be arranged that the number of the nozzles 12 is made plural and that the number of the processing units governed by each of the nozzles 12 is selected. The operation of these coating apparatuses can be controlled by computers.

Figure 6:
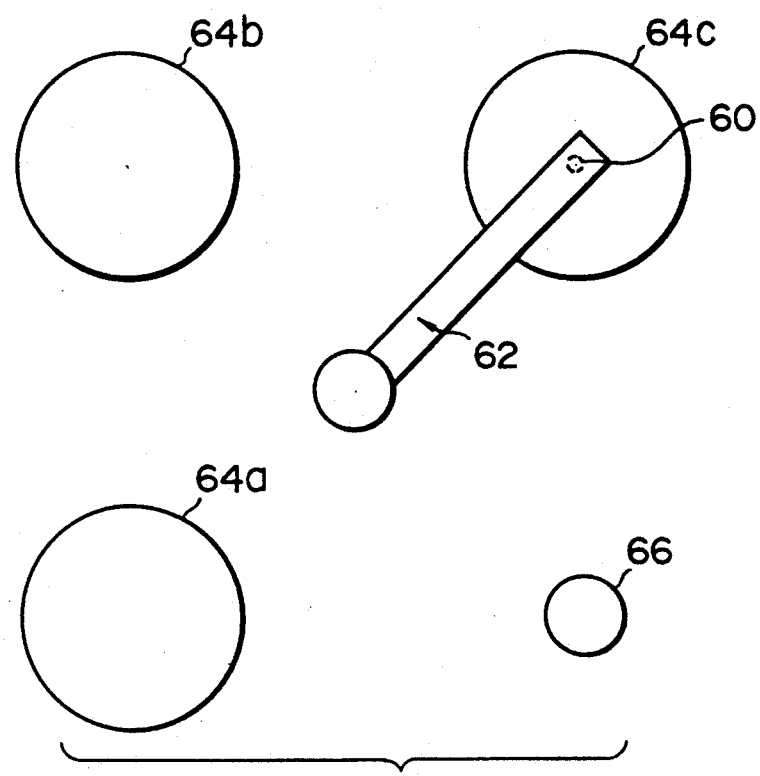
FIGS. 6 and 7 are sectional views showing variations of the coating apparatus according to the present invention.
Figure 7:
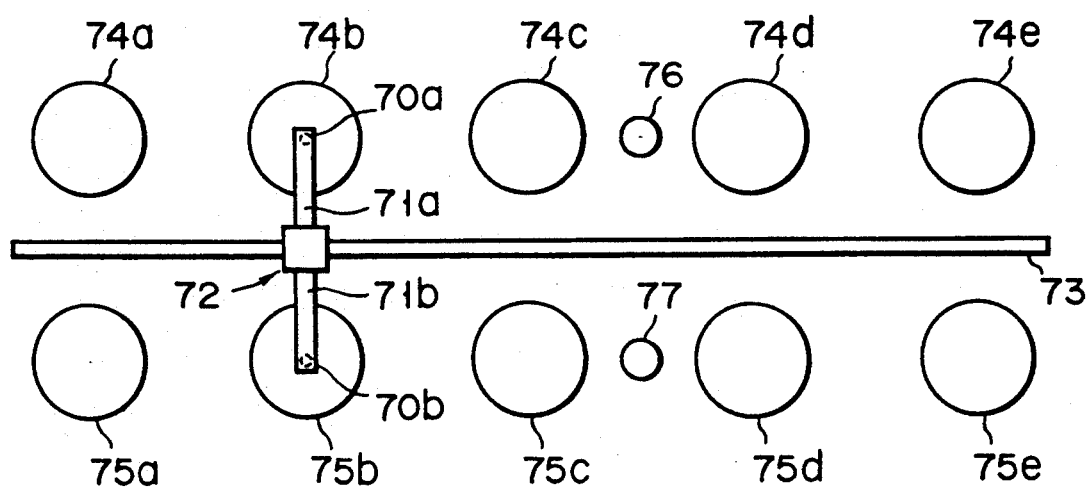

FIGS. 6 and 7 schematically show variations of the coating apparatus according to the present invention wherein three or more processing units are arranged relative to one nozzle.

In FIG. 6, a resist nozzle 60 is carried by a moving means 62 of the swing type. Three processing units 64a–64c and a waiting trench 66 are arranged on that track on which the moving means 62 is swung.

In FIG. 7, two resist nozzles 70a and 70b are carried by a moving means 72 which is provided with a pair of moving arms 71a and 71b extending in reverse directions from it and with a linear rail 73. Five processing units 74a–74e and a waiting trench 76 are arranged on the side of the nozzle 70a and five processing units 75a–75e and a waiting trench 77 are arranged on the side of the nozzle 70b.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A coating apparatus comprising:
   two chucks for horizontally fixing, supporting and rotating a wafer-like substrate;
   two cups surrounding the two chucks, respectively;
   a carrying member commonly used for the two chucks and being able to load and unload a substrate to and from either of the chucks while the other chuck is being used;
   coating liquid supply means including a nozzle for supplying a coating liquid onto the substrates supported by the chucks; and
   moving means for moving the nozzle between the chucks.

2. The coating apparatus according to claim 1, wherein the chucks are arranged in a casing and held in a same operating atmosphere, and the carrying member is located outside the casing.

3. The coating apparatus according to claim 2, further including a waiting trench located between the chucks and for discharging that part of the coating liquid which stays in the nozzle.

4. The coating apparatus according to claim 2, wherein another substrate processing mechanism associated with the coating apparatus is located adjacent to the casing and the carrying member is used commonly by this another substrate processing mechanism.

5. A resist-coating apparatus comprising:
   two chucks for horizontally fixing, supporting and rotating a wafer-like substrate;
   two cups surrounding the two chucks, respectively;
   a carrying member commonly used for the two chucks and being able to load and unload a substrate to and from either of the chucks while the other chuck is being used;
   coating liquid supply means including a nozzle for supplying a coating liquid onto the substrates supported by the chucks;
   moving means for moving the nozzle between the chucks; and
   a waiting trench located between the chucks to discharge that part of the coating liquid which stays in the nozzle.

6. The coating apparatus according to claim 5, wherein the chucks are arranged in a casing and held in a same operating atmosphere, and the carrying member is located outside the casing.

7. The coating apparatus according to claim 6, wherein another substrate processing mechanism associated with the coating apparatus is located adjacent to the casing and the carrying member is used commonly by this another substrate processing mechanism.

8. The coating apparatus according to claim 5, wherein said waiting trench serves as a means on which the nozzle is mounted at the time when the nozzle is at its waiting position.

* * * * *